(12) United States Patent
Wang et al.

(10) Patent No.: US 8,907,267 B2
(45) Date of Patent: Dec. 9, 2014

(54) CHARGED PARTICLE BEAM DEVICE

(75) Inventors: Zhigang Wang, Tokyo (JP); Nobuhiro Okai, Tokyo (JP); Hidetoshi Sato, Tokyo (JP); Ritsuo Fukaya, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/240,306

(22) PCT Filed: Aug. 16, 2012

(86) PCT No.: PCT/JP2012/070799
§ 371 (c)(1),
(2), (4) Date: Feb. 21, 2014

(87) PCT Pub. No.: WO2013/027644
PCT Pub. Date: Feb. 28, 2013

(65) Prior Publication Data
US 2014/0217274 A1    Aug. 7, 2014

(30) Foreign Application Priority Data
Aug. 22, 2011    (JP) .................................. 2011-180100

(51) Int. Cl.
| | | |
|---|---|---|
| *H01J 37/28* | (2006.01) | |
| *H01J 37/26* | (2006.01) | |
| *H01J 37/29* | (2006.01) | |
| *H01J 37/153* | (2006.01) | |

(52) U.S. Cl.
CPC .............. *H01J 37/265* (2013.01); *H01J 37/29* (2013.01); *H01J 37/153* (2013.01)
USPC ..................................................... 250/252.1

(58) Field of Classification Search
None
See application file for complete search history.

(56) References Cited

U.S. PATENT DOCUMENTS

| | | | | |
|---|---|---|---|---|
| 2003/0075691 A1* | 4/2003 | Abe | ........................... | 250/491.1 |
| 2005/0045821 A1* | 3/2005 | Noji et al. | ...................... | 250/311 |
| 2008/0078943 A1* | 4/2008 | Kawai | ............................ | 250/397 |
| 2011/0174975 A1* | 7/2011 | Sasaki et al. | ................... | 250/310 |

FOREIGN PATENT DOCUMENTS

| | | |
|---|---|---|
| JP | 2000-036276 A | 2/2000 |
| JP | 2005-142259 A | 6/2005 |
| JP | 2007-042513 A | 2/2007 |
| WO | 2010/061516 A1 | 6/2010 |
| WO | 2010/082477 A1 | 7/2010 |

OTHER PUBLICATIONS

International Search Report issued in International Application No. PCT/JP2012/070799 issued Sep. 18, 2012.

* cited by examiner

*Primary Examiner* — Marcus Taningco
(74) *Attorney, Agent, or Firm* — McDermott Will & Emery LLP

(57) ABSTRACT

This charged particle beam device is characterized by controlling a deflector in a manner so as to correct the amount of scanning deflection of a charged particle beam between: a first detection condition for detecting a secondary charged particle (112) signal; and a second detection condition for detecting a reflected charged particle (111) signal. As a result, it is possible to correct length measurement error and scaling fluctuation arising when altering the type of charged particle to detect. Thus, in the observation, measurement, and the like of a low-step sample or a charged sample, even when forming an image that is on the basis of the reflected charged particle signal, it is possible to obtain an accurate image regardless of length measurement error and scaling fluctuation.

12 Claims, 11 Drawing Sheets

THRESHOLD METHOD

COLLINEAR APPROXIMATION METHOD

THRESHOLD
METHOD

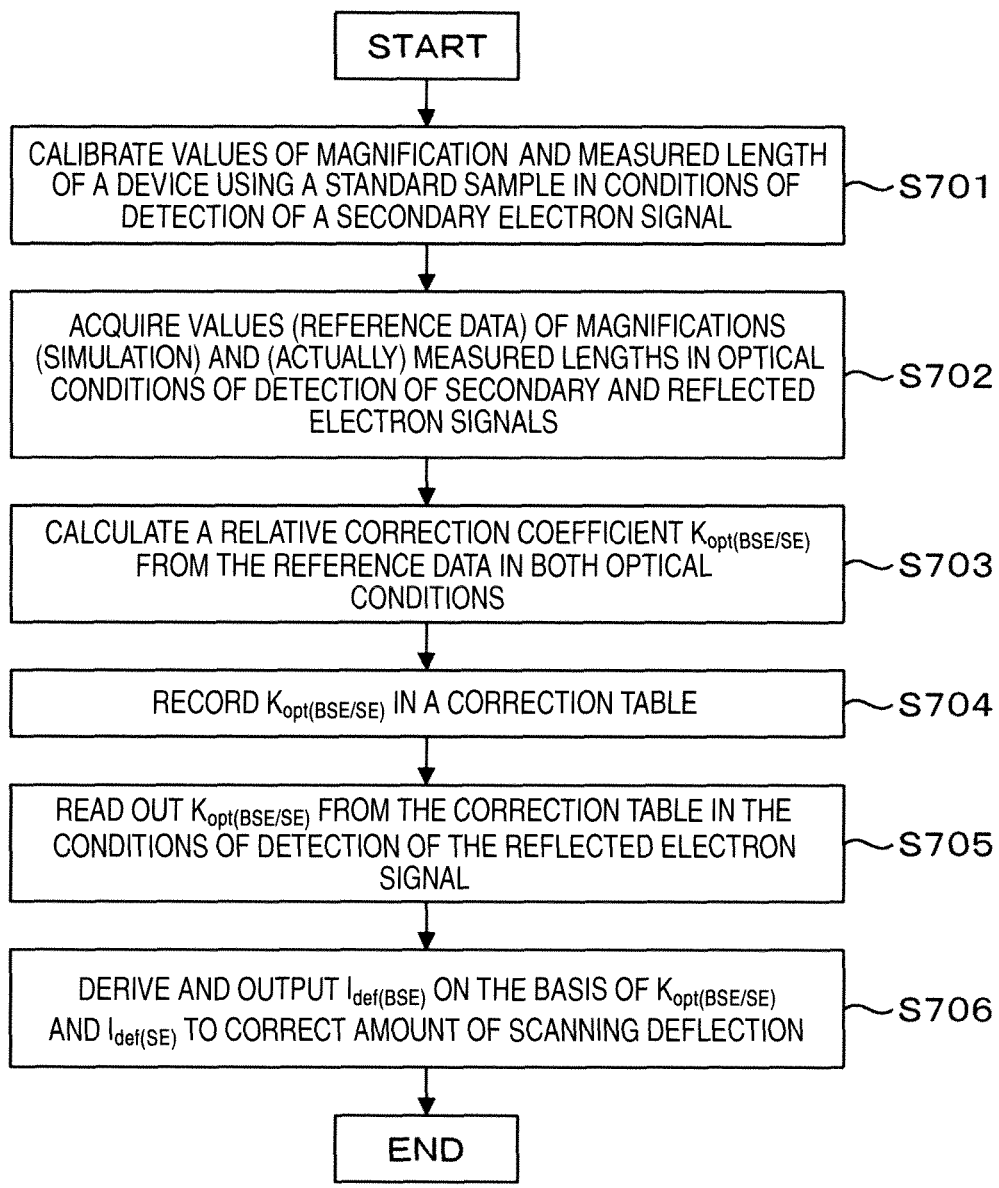

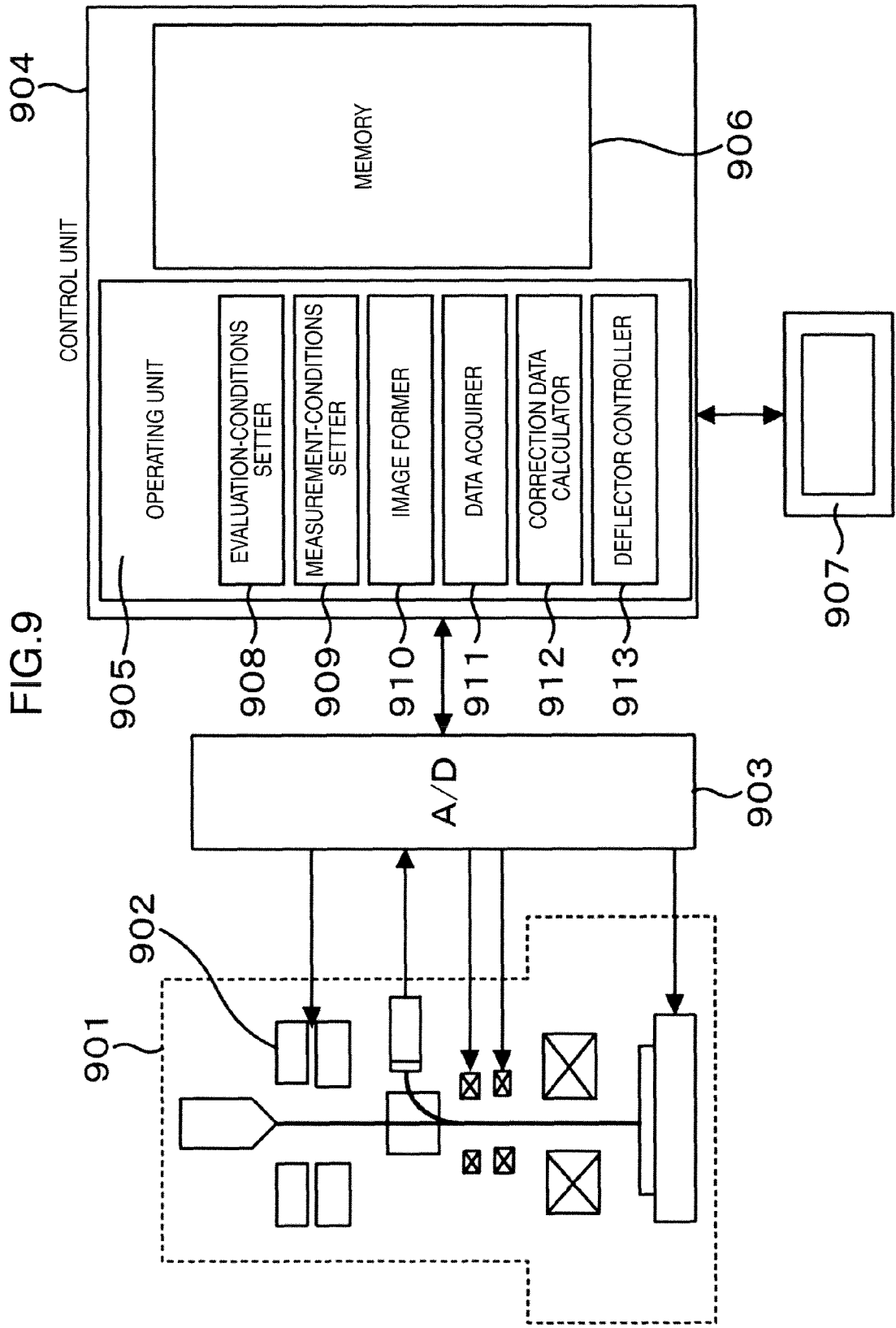

FIG.10B

| ACQUIRED DATA | SE | BSE | $K_{opt(SE/BSE)}$ | $I_{def(SE)}$ | $I_{def(BSE)}$ |
|---|---|---|---|---|---|
| (ACTUALLY) MEASURED DIMENSION VALUE P | ⋮ | ⋮ | * | ⋮ | ⋮ |
|  | ⋮ | ⋮ | * | ⋮ | ⋮ |
| MAGNIFICATION M (SIMULATION) ⋮ | ⋮ | ⋮ | * | ⋮ | ⋮ |

CHARGED PARTICLE BEAM DEVICE

RELATED APPLICATIONS

This application is the U.S. National Phase under 35 U.S.C. §371 of International Application No. PCT/JP2012/070799, filed on Aug. 16, 2012, which in turn claims the benefit of Japanese Application No. 2011-180100, filed on Aug. 22, 2011, the disclosures of which Applications are incorporated by reference herein.

TECHNICAL FIELD

The present invention relates to a charged particle beam device, and more particularly, to a device, method, and computer program which are suitable for observation and measurement of a sample with a high accuracy using a reflected electron image.

BACKGROUND ART

As one of devices for performing observation and measurement of a sample using an electron beam, there exists a scanning electron microscope (SEM). The SEM acquires a two-dimensional image reflecting a surface configuration of a sample, by irradiating the sample with an electron beam and by detecting electrons emitted from the sample in the form of a signal.

The electron beam arrives at the sample and the arrived electron beam causes atoms on the sample surface to be excited, which emits a signal electron having a low energy. The signal electron is referred to as a secondary electron. When an electron beam is applied on an edge part of such a sample having irregularities as a semiconductor circuit pattern, this causes an edge effect to generate secondary electrons and increase the amount of such electrons, which results in formation of an image a contrast dependent on the irregularities.

On the other hand, an electron, again emitted from the sample surface while the electron beam is scattered in the sample, is referred to as a reflected electron. Such reflected electrons are signal electrons having high energies and form an image having a contrast not depending upon the irregularities of the sample but depending upon the composition of the sample.

In these years, as a process for a semiconductor, a magnetic head or the like is more complicated, and such measurement of a low-step sample as not having irregularities on the observation surface of a sample are more required. In such a case, the amount or magnitude of detected secondary electron signal is reduced. To avoid this, reflected electrons in place of secondary electrons are detected, and the signals and images are synthesized to reinforce information on edge and contrast, thus enabling enhancement of the image quality and the length measurement accuracy. The aforementioned method is valid, because, when the irradiation of the electron beam in the SEM observation causes the surface to be charged to several and several tens of volts (v), and even when this forms a barrier for the secondary electrons, reflected electrons can be detected.

There is disclosed in PATENT LITERATURE 1 a technique in which, when a reflected electron is detected and amplified, scanning conditions for an electron beam applied onto a sample before change of a magnification are set to be nearly the same as scanning conditions after the magnification change so as to form a suitable reflected electron image regardless of the magnification change. PATENT LITERATURE 2 explains a method by which, after a secondary electron image is selectively displayed and then adjusted in magnification and so on, the brightness and contrast of the secondary electron image are changed and adjusted operatively with the brightness and contrast of the secondary electron image of a reflected electron image not selectively displayed yet, and then observation is made by switching the display to the reflected electron image. PATENT LITERATURE 3 discloses the effect that, in order to detect and process a reflected electron signal or a secondary electron signal and an X-ray signal to obtain an integrated signal having a high contrast and signal/noise ratio (S/N ratio), respective magnifications, biases and weighting proportions are controlled for addition and division processing.

CITATION LIST

Patent Literatures

PATENT LITERATURE 1: JP-A-2007-42513
PATENT LITERATURE 2: JP-A-2000-36276
PATENT LITERATURE 3: JP-A-2005-142259

SUMMARY OF INVENTION

Technical Problem

In observation and measurement of a sample in a SEM, in order to obtain a highly reliable image and keep length measured result, it is desirable to calibrate a magnification of the device, a measured length value of dimensions, and so on. In a length measuring SEM (CD-SEM: Critical Dimension SEM), in particular, it is considered to measure a multiplicity (hundreds to thousands) of patterns in a very small area range (such as hundreds of µm multiplied by hundreds of µm) on a sample, and thus such a highly accurate calibration is required.

Generally speaking, calibration management of magnification and measured length value is carried out by acquiring an image and measuring dimensions under constant conditions with use of a standard sample (microscale) of known dimensions made of a silicon material. More specifically, the device is adjusted so as to obtain an accurate measured length value by finding a magnification correction coefficient from the measured length value and by correcting an amount of scanning deflection. Measurement of dimensions of the standard sample itself is managed by a calibration device based on light diffraction when a diffraction grating of an irregular grating pattern on the sample is irradiated with a laser or the like.

In this way, when calibration is carried out with use of the standard sample, as mentioned above, a sufficient amount of signals is detected when the secondary electron sensitive to an edge of an irregular sample is used. Thus, the device can be adjusted with a high image quality and a high accurate length measurement. When the reflected electron not depending upon irregularities of the sample is used, on the other hand, it is difficult to obtain an image quality equivalent to the use of the secondary electron in current standard samples made of the same silicon material, and thus the device cannot be adjusted accurately.

To avoid this, it is required that, even when a reflected electron image is obtained, the secondary electron image be used at the time of adjustment of magnification or the like, and optical conditions be changed and changeover be made to detection of the reflected electron signal at the time of observation and measurement.

In a SEM having a mechanism for detecting signals of both of the secondary electrons and the reflected electrons, when optical conditions are changed to switch the type of the detection-target signal electron, the magnification may be varied in some cases. In such a case, since a different value from the actual image magnification is obtained, this affects measured values of dimensions or the like. Accordingly, when changeover of the optical conditions are made between the secondary and reflected electrons, it becomes necessary to suitably perform the calibration paying consideration to the magnification variation and a measured length value error caused by the magnification variation.

In the methods disclosed in PATENT LITERATURES 1 and 2, however, no consideration is paid to changes in the magnification and measured length value upon detection of the reflected electron signal. Further, in the method disclosed in PATENT LITERATURE 3, it is possible to adjust magnifications or the like of the respective signals in order to obtain an integrated signal. Further, the method disclosed in PATENT LITERATURE 3 can adjust the magnifications or the like of the respective signals to acquire the integrated signal, but fails to disclose a detailed method of correcting the magnification variations or measured length value error caused by a change of the optical conditions upon detection of the different signals. Thus, even use of any of the aforementioned methods cannot directly solve the problem in the present invention.

An object of the present invention to provide a charged particle beam device, method and computer program which can accurately correct a magnification variation and a measured length value error caused by switching signal detection between secondary and reflected electron signals.

Solution to Problem

In accordance with an embodiment, the above object can be obtained by providing a method of finding a relative correction coefficient between secondary and reflected electron signals on the basis of previously-obtained data of magnification or measured length value under respective electron optical conditions of detection of the both electron signals and of correcting an amount of scanning deflection when the detection signal is switched to the reflected electron signal on the basis of a device calibration result with use of the correction coefficient and a secondary electron signal image, by providing a device for implementing the correction and by providing a computer program therefor.

Advantageous Effects of Invention

In accordance with the above embodiment, even when signal detection is switched between the secondary and reflected electrons, accurate observation and measurement of a sample can be obtained regardless of the magnification variation and measured length value error.

Other objects, features and advantages of the present invention will be obvious from the following description of the present invention in connection with the attached drawings.

BRIEF DESCRIPTION OF DRAWINGS

FIG. 7 is a detailed flow chart for correcting an amount of scanning deflection when changeover is made from secondary electron to reflected electron.

FIG. 9 is a schematic arrangement of a semiconductor measurement/inspection system including the SEM.

FIG. 10B shows a graph showing magnification and dimension measured value upon detection of a secondary electron signal and a reflected electron signal, and also an example of a correction table.

DESCRIPTION OF EMBODIMENTS

Figure 2A:
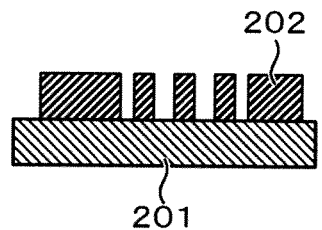
FIG. 2A schematically shows a cross sectional view of a semiconductor wafer and a magnetic head.
Figure 2B:
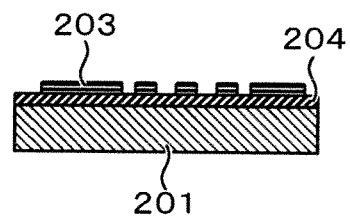
FIG. 2B schematically shows a cross sectional view of a semiconductor wafer and a magnetic head.
Figure 2C:
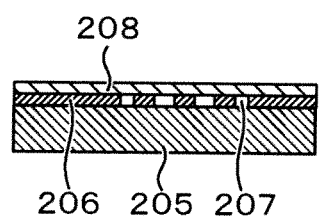
FIG. 2C schematically shows a cross sectional view of a semiconductor wafer and a magnetic head.

A relationship between an irregular surface configuration of a sample and a detected electron signal will be explained below by using the attached drawings. FIG. 2A shows a cross sectional view of a sample when a stepped pattern is formed in the sample, and FIGS. 2B and 2C show cross sectional views of respective samples when a sample is formed therein with a low-step pattern and when a sample is coated thereon with a thin film having a substantially nonstep respectively. In this connection, materials used in the following description are given as examples, and the invention is not limited to the specific examples.

A substrate 201 used in FIGS. 2A and 2B is made of a material such as synthetic silica glass having a high transmissivity in an ultraviolet light region, and circuit patterns 202 and 203 formed on the substrates are made of a material having a low ultraviolet light transmissivity such as chromium (Cr) or molybdenum silicon oxide (MoSiO). In some sample preparing step, Cr may be formed on MoSiO.

In a photomask for transfer of a semiconductor wafer, as a pattern becomes miniaturized, a flat panel or the like, in these years, it has become difficult to form a resist pattern faithfully to design data. In order to solve the problem, an attempt has been made to prepare not such a pattern having steps as shown in FIG. 2A but such a low-step sample made by making a thin type of chromium (Cr) film 204 on the photomask as shown in FIG. 2B to thereby increase a uniformity of a pattern in the in-plane of the mask. Since such a low-step sample cannot have an edge effect and thus a magnitude or level of secondary signal is reduced, however, the accurate observation and length measurement by a SEM cannot be achieved.

A magnetic head sample for use of a hard disk has a flat surface structure which has an $Al_2O_3$ 206 as a circuit pattern, a pattern of a permalloy (Fe—Ni) 207 as an alloy, and a diamond-like carbon 208 having a thickness of about several nanometers as a surface protective film, respectively coated on a ceramic substrate 205 of $Al_2O_3$—TiC(AlTiC) as shown in FIG. 2C as an example. Thus, as in the aforementioned case, a reliability in the accuracy of sample observation and length measurement is reduced.

There sometimes occurs such a case that, with respect to even a sample having a charged surface, the quality of a secondary electron image is deteriorated and thus the sample cannot be observed accurately. This is because the substrate 201 on the photomask is made of an insulator material such as glass, in which charge up (positive charge) is gradually advanced in measurement and generates a potential barrier, which results in the fact that secondary electrons cannot be escaped from the surface of the sample and cannot be detected.

When such a sample as difficult to obtain a secondary electron image as shown FIGS. 2B and 2C is used and when it is required to detect a reflected electron signal in place of the secondary electron signal in the sample; an embodiment, which is explained below, is applied.

In the following explanation, accurate magnification calibration and measured length value calibration are previously carried out with use of a standard sample on the basis of an secondary electron image, a relative correction coefficient for the both signals is found from reference data about magnifications of a secondary and reflected electron signal and about measured length values in various optical conditions obtained from simulation or actual measurement, an amount of scanning deflection is corrected on the basis of the correction coefficient, and the magnification for the reflected electron image and measured length value are accurately adjusted.

In the following embodiment, explanation is made in connection with an example of a SEM, a control device mounted on the SEM, or a control device connected to the SEM via a communication line or the like. However, the present invention is not limited to this example, but may be implemented in such a manner that processing is carried out with use of a general-purpose operating device under control of a computer program. Even when a sample is observed and measured with use of another charged particle beam device, the above explanation may be applied thereto.

The present invention is not limited to application of the samples shown below in the present embodiment. The invention may be effectively applied to various samples including other samples of a low-step sample, a flat sample, a charged sample, a sample having a high aspect ratio and difficult to detect a secondary electron from the bottom of a deep hole, in which case, changeover is made between the secondary and reflected electron signals, the reflected electron signal is detected in place of the secondary electron signal, or detection is carried out by adjusting a mixture ratio of the both signals.

Embodiment 1

Figure 1:
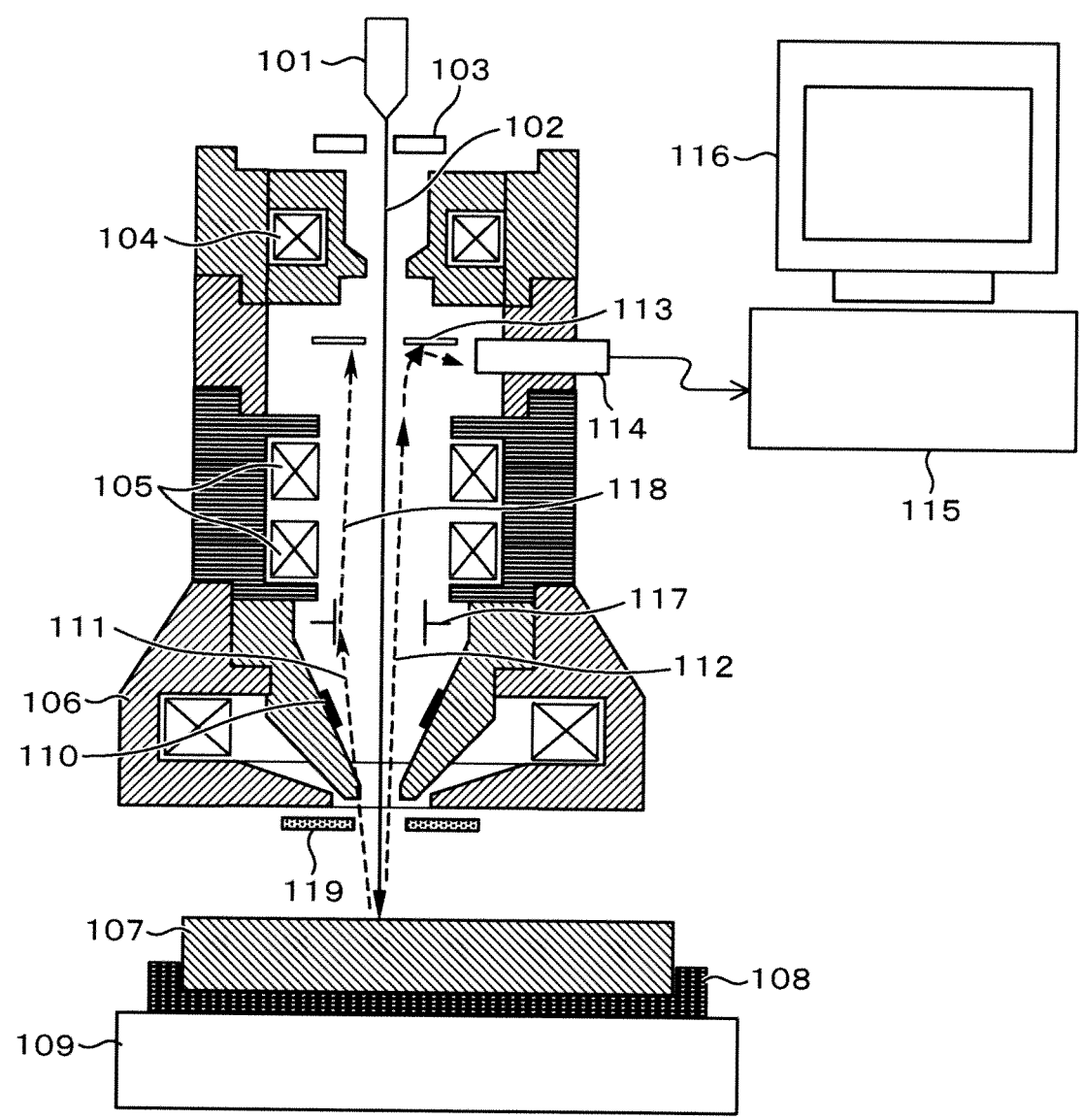
FIG. 1 schematically shows a scanning electron microscope (SEM).

FIG. 1 schematically shows an arrangement of a scanning electron microscope (SEM). An electron beam 102 emitted from an electron gun 101 is accelerated by an acceleration electrode 103, converted by a condenser lens 104 and then deflected by a deflector 105. Thereafter, the beam decelerated by a negative voltage (retarding voltage) applied to a side of a sample 107, converged by an objective lens 106 to an electron beam having a diameter (of eventually a nanometer order), and the directed onto the surface of the sample 107 as an observation target.

The incident primary electrons are partially reflected backward to form a reflected electron 111 (back scattering electron), and are partially scattered within the sample to form a secondary electron 112. In this case, the word "retarding voltage" means a negative voltage applied to a side of the sample 107 (a sample holder 108 or a sample stage 109) in order to converge the electron beam 102 without damaging a circuit pattern on the sample 107, whereby an irradiation energy of the electron beam 102 is controlled by the retarding voltage.

The generated reflected electron 111 and secondary electron 112 are collided with a reflector 113 to generate a new electron, and a new electron is detected by a detector 114. A photomultiplier tube is incorporated in the detector 114 and generates a voltage according to an amount of detected electrons. Thus, the generated voltage is processed by a signal processor 115 and then displayed on an image display unit 116 in the form of an image. The signal processor 115 forms a profile waveform having a signal amount as an ordinate axis and the scanning position of the electron beam as an abscissa axis on the basis of the secondary electrons emitted from the sample. The signal processor is operated so as to measure dimensions of a pattern by finding a distance between peaks in the profile waveform.

Explanation will next be made as to optical conditions when the signals of the secondary electron 112 and reflected electron 111 are detected. The secondary electron is a signal electron having a low energy smaller than about 50 eV, while, the reflected electron is a signal electron having a high energy not smaller than about 50 eV. Accordingly, these signals can be selectively detected by controlling voltages applied to respective electrodes and other optical parameters in the SEM, and changeover can be made between the both signals. The above conditions are set mainly in (1) an electron optical system and/or (2) an electron detection system.

In the case (1), for example, when a negative voltage (booster voltage) larger than a voltage possessed by the sample 107 is applied to an opposing electrode 119 or to a booster electrode 110 located above the objective lens 106, the secondary electron 112 having the low energy can be returned toward the sample 107 and only the reflected electron 111 having the high energy can be selectively detected. In this case, a positive voltage is applied to a conversion electrode 117 so that the reflected electron 111 moved beyond the objective lens 106 toward the electron gun 101 is further moved upward and introduced into the detector 114 (refer to a reflected electron 118). The electrode for application of the negative voltage is not limited to the example in the present embodiment.

When the reflected electron 111 is detected by the aforementioned method, any of a low angle component generated at a shallow angle from the sample 107 and a high angle component generated at a high angle can be detected, and therefore an overall yield becomes high.

Figure 8:
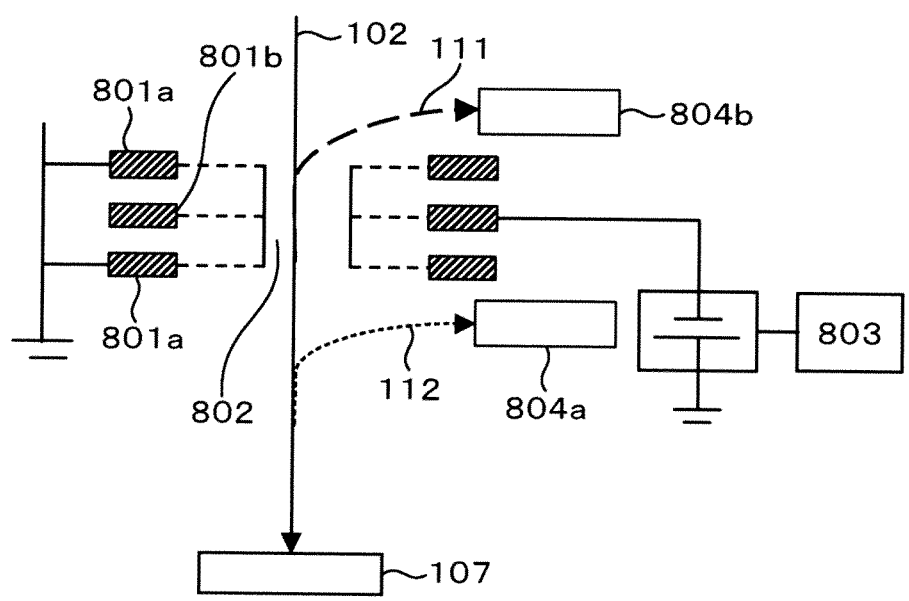
FIG. 8 is a basic arrangement of an energy filter.

In the case (2), such a method is employed that an energy filter separates electrons emitted from the sample 107 according to the magnitude of energy. FIG. 8 shows a basic structure of an energy filter. The energy filter includes 2 sheets of a shield mesh 801a and a filter mesh 801b. These mesh sheets are provided therein with openings 802 for passage of the electron beam 102 therethrough. A single or plurality of sheets of such filter meshes 801b may be employed and have a filter application voltage connected to a power supply 803. The reflected electron 111 and secondary electron 112 separated according to the magnitude of the energy are detected by a reflected electron detector 804a and by a secondary electron detector 804b respectively.

In the aforementioned method, only the reflected electron 111 having the high angle component reflected at the high angle from the sample 107 nearly toward the optical axis direction can be accurately detected. The above methods of the cases (1) and (2) may be suitably combined depending upon the object or application.

The present embodiment is not limited to the cases (1) and (2), but may be applied to another case where signal detection optical conditions for the reflected electron 111 and for the secondary electron 112 can be set by controlling optical parameters including voltages and currents applied or supplied to other electrodes or coils of the SEM.

In this connection, the voltages or currents are applied or supplied to the respective electrodes or coils of the SEM under control of a control device (which will be explained later in FIG. 9). The control device includes an operating unit, and the operating unit controls the device under control of a SEM operational program called a recipe.

FIG. 9 schematically shows an arrangement of a semiconductor measurement/inspection system including a SEM. The system includes a SEM main unit 901, an A/D converter 903 and a control unit 904. The control unit 904 includes an evaluation-conditions setter 908, a measurement-conditions setter 909, an image former 910, a data acquirer 911, a correction data calculator 912, and a deflector controller 913.

The SEM main unit 901 irradiates a sample such as a semiconductor wafer with an electron beam, and traps electrons emitted from the sample with use of a detector 902, and the A/D converter 903 converts the trapped electrons into a digital signal. The digital signal is input to the control unit 904 and stored in a memory 906 therein, and image-processed according to its object by image processing hardware such as a CPU built in an operating unit 905 having various functions. The operating unit 905 has a function of creating a line profile on the basis of the detection signal and measuring a dimension between peaks of the profile.

The control unit 904 is connected to an input unit 907 having an input means, and a display unit or an external display (not shown) provided to the input unit 907 has a GUI (Graphical User Interface) function or the like function of displaying an image and a measured result to an operator.

In this connection, part or all of the control and processing operations in the control unit 904 may also be carried out by allocating part or all of the control and processing operations to a CPU or an electronic computer or the like having a memory capable of storing an image therein. The control unit 904 may be connected via a network to an imaging recipe preparing device which can read out from the memory an imaging recipe including coordinates of an electronic device, a pattern matching template for use in positioning and imaging conditions, required for measurement or the like, or which can prepare the recipe manually or by using design data of the electronic device.

Figure 3A:
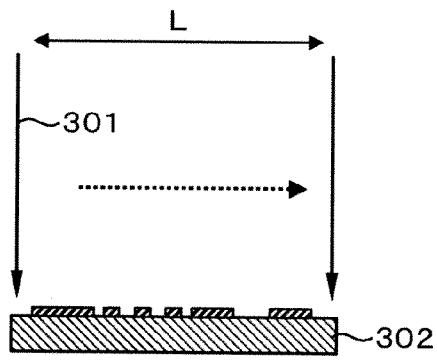
FIG. 3A is a view for schematically explaining a principle of magnification control of a SEM based on electron beam scanning.
Figure 3B:
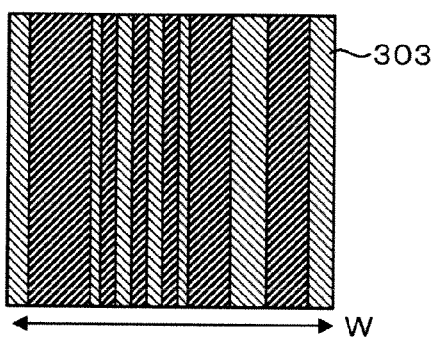
FIG. 3B is a view for schematically explaining a principle of magnification control of a SEM based on electron beam scanning.

A basic concept of magnification in a SEM will be explained in connection with FIG. 3. FIG. 3A schematically shows a cross sectional view for explaining electron beam scanning on a sample. When it is assumed that L denotes a scanning width when the surface of a sample 302 is scanned with an electron beam 301, that is, a deflection width of the electron beam 301 on the sample, and that W denotes a display width of an image 303 shown in FIG. 3B and formed through signal processing; then magnification M is defined by an equation (1) as shown below.

[MATH. 1]

$$M = W/L \qquad (1)$$

Figure 3C:
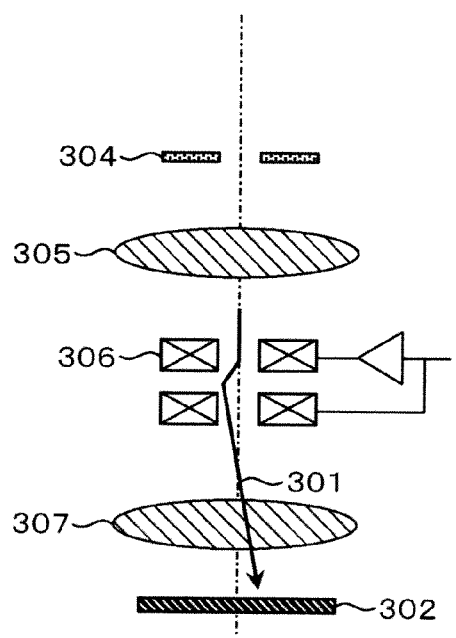
FIG. 3C is a view for schematically explaining a principle of magnification control of a SEM based on electron beam scanning.

Assuming, for example, that a deflection width on the sample 302 is 1 μm and a display width of the image is 100 mm, then the magnification is increased by 100,000 times. FIG. 3C shows a positional relationship among lenses, a deflector, a scanning coil and so on in the electron optical system of the SEM. After the electron beam 301 is passed through an objective aperture 304, the beam is converted into a condenser lens 305, and then scanned on the sample 302. At this time, the optical system is adjusted so that, when a constant electric field or magnetic field is applied to a deflector 306 provided above an objective lens 307, the electron beam is scanned and deflected with a constant width on the sample. A relationship among the deflection width L of the sample surface, the magnification M, an application voltage $V_a$ for the primary electron beam, and a deflection current $I_{def}$ applied to the deflector, is shown by an equation (1) below.

[Math. 2]

$$I_{def} = K_{elc} K_{opt} L \sqrt{V_a} = K_{elc} K_{opt} \sqrt{V_a} \frac{W}{M} \qquad (2)$$

$V_a$: an application voltage for the primary electron beam,
$K_{elc}$: an electric characteristic correction coefficient of the deflector relating to the magnification,
$K_{opt}$: an electron optical system correction coefficient (for example, a circuit characteristic coefficient, an A/D conversion control coefficient, etc) of the deflector relating to the magnification,
where, $K_{opt}$ denotes a function of an optical parameter associated with the application voltage $V_a$ influencing the electron optical system or acting on the energy of the electron beam applied on another sample although not shown in equation (2).

In order to obtain accurately measured dimensional values of the sample, it is necessary to calibrate the deflection width L of the SEM for a constant magnification M. Such calibration can be achieved by correcting the output of $I_{def}$ for controlling a scanning deflection with respect to the deflector.

The calibration management of the measured length values is carried out by using the standard sample as mentioned above. The standard sample is scanned with an electron beam with a constant magnification or the like, and a scanning deflection is corrected so that dimensions of a line/space pattern of the acquired SEM image become the same.

In this connection, when changeover is made between detection signals of the secondary electron and reflected electron in order to observe a low-step sample, a charged sample or the like; a change in optical conditions by potential control acts on the deflection of the primary electron on the optical path, whereby $K_{opt}$ is largely changed.

In the present embodiment, a magnification variation and a measured length value error are estimated at the time of changeover between the detection signals and a scanning deflection is corrected, by finding a relative correction coefficient $K_{opt(BSE/SE)}$ under conditions at the time of detection of the secondary electron signal and reflected electron signal with use of previously-acquired reference data.

Explanation will be made as to a detailed flow for correcting a scanning deflection when changeover is made from the detection signal of the secondary electron to the detection signal of the reflected electron. First of all, measured length value calibration of device using a standard sample and using the secondary electron signal is carried out (S701). Next, simulation of magnifications and measured length values under optical conditions of detection of respective signals of secondary and reflected electrons as reference data is carried out or actually-measured data is acquired (S702). The above $K_{opt(BSE/SE)}$ is calculated from the acquired data (S703). In this connection, data to be acquired is not limited to data shown in the present embodiment, but may be such another value associated with magnification or the like including the value of the deflection width L as capable of finding the $K_{opt(BSE/SE)}$. In this case, since even changeover between the detection signals causes no change of $K_{elc}$ in equation (2), $K_{opt(BSE/SE)}$ can be found by calculation. The found $K_{opt(BSE/SE)}$ is recorded and a correction table is created (S704). The execution of steps S702 to S704 according to the above flow may be exchanged, if necessary, with steps of previously executing the device, finding $K_{opt(BSE/SE)}$ and previously recording the found $K_{opt(BSE/SE)}$. On the basis of the $K_{opt(BSE/SE)}$ read out from the correction table and the value of $I_{def(SE)}$ calibrated in the step S701; $I_{def(BSE)}$ upon detection of the reflected electron signal is derived and output (S705 and S706). By the aforementioned method, accurate magnification and measured length value reflecting the calibration result of the secondary electron can be obtained even during acquisition of a reflected electron signal image. In this connection, in FIG. 9, the aforementioned reference data and $K_{opt(BSE/SE)}$ can be stored in the memory 906 of the control unit 904, reading out of the correction table can be carried out by the data acquirer 911 of the operating unit 905, derivation of $I_{def(BSE)}$ can be carried out by the correction data calculator 912, and correction of the scanning deflection based on the derived $I_{def(BSE)}$ can be carried out by the deflector controller 913, respectively.

Even when changeover is made to the detection of the secondary electron signal after acquisition of the accurately-adjusted reflected electron image, magnification and so on can be adjusted by using the relative value of the aforementioned correction coefficient. For this reason, observation and length measurement can be achieved without again performing calibration using the standard sample.

Figure 10A:
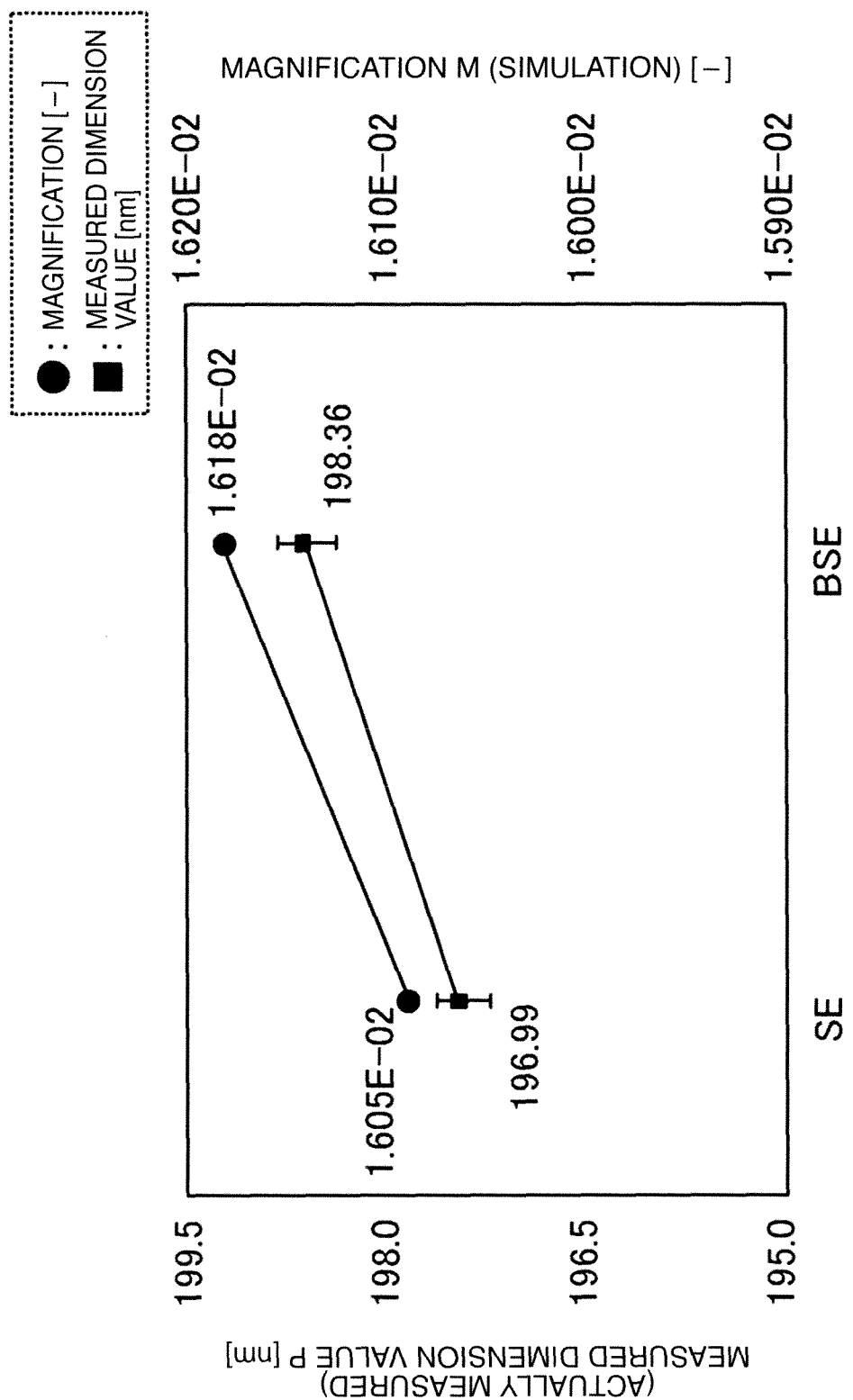
FIG. 10A shows a graph showing magnification and dimension measured value upon detection of a secondary electron signal and a reflected electron signal, and also an example of a correction table.

FIG. 10A is a graph showing simulation data about magnification and actually-measured data about measured length value under optical conditions of detection of the secondary and reflected electron signals. $K_{opt(BSE/SE)}$ may be found according to equations of approximation straight lines of these data. FIG. 10B is a correction table showing the values of $K_{opt(BSE/SE)}$ found by using the magnification and measured length value, the values of $I_{def(SE)}$ at the time of detection of the secondary electron signal, and the values of $I_{def(BSE)}$ obtained by using these values at the time of detection of the reflected electron signal. In the correction table, part or all of these values may be recorded, or other optical parameters or the like may be added to the table according to conditions or objects.

Embodiment 2

In the embodiment 1, explanation has been made as to the method of deriving a suitable $I_{def(BSE)}$ and correcting a deflection scanning amount when changeover is made between the detection signals of the secondary and reflected electrons. A method of finding actually-measured dimension values at the time of detection of the secondary and reflected electron signals as shown in the step S702 will now be explained.

Figure 4A:
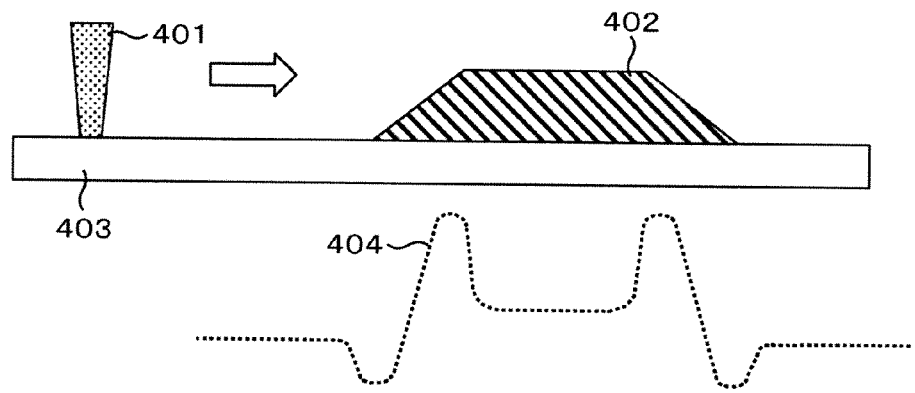
FIG. 4A shows a electron beam scanning, a signal waveform, and a line profile on a sample under optical conditions of detection of a secondary electron signal.
Figure 4B:
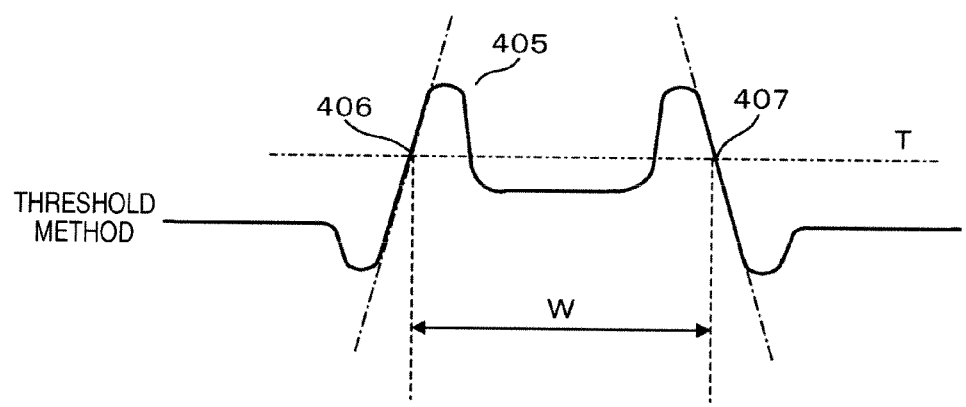
FIG. 4B shows a electron beam scanning, a signal waveform, and a line profile on a sample under optical conditions of detection of a secondary electron signal.
Figure 4C:
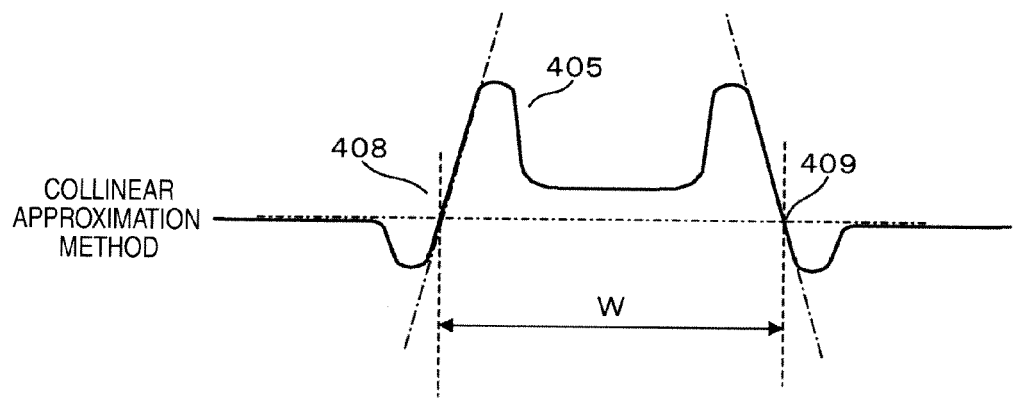
FIG. 4C shows a electron beam scanning, a signal waveform, and a line profile on a sample under optical conditions of detection of a secondary electron signal.

FIG. 4A shows electron beam scanning on a rough surface of a sample and a waveform of a secondary electron signal processed by the signal processor 115. When a surface of a sample 403 is scanned with an electron beam 401, a line profile 404 of the secondary electron signal of electrons generated from a circuit pattern 402 is obtained. Edge positions are detected from the obtained signal and a measured length value between the edge positions is calculated. At this time, in order to increase an S/N ratio, the secondary electron signal is subjected to waveform smoothing and differentiating operations. In these waveform processing operations, there are there are various algorithms for detecting the edge positions and finding dimensions; but a threshold method, a collinear approximation method or the like is usually employed among the algorithms. FIG. 4B is a diagram for explaining the threshold method, and FIG. 4C is a diagram for explaining the collinear approximation method. In the threshold method, the line profile 404 is subjected to smoothing operation; and a distance W between points 406 and 407 of intersection of slope parts of both ends of a waveform 405 after smoothed at both ends and a predetermined threshold value T is used as a dimension of the circuit pattern 402. The threshold value T is determined usually as a predetermined ratio to a maximum height of the waveform. In the collinear approximation method, slope parts of at both ends of the smoothed waveforms are further differentiated, and a point having a maximum tilt in the smoothed waveform is determined from an extreme point in the differentiated waveform. A line tangential to the maximum tilt point of the waveform is drawn, the distance W between intersection points 408 and 409 and a base line are determined as dimensions of the circuit pattern 402.

Figure 5A:
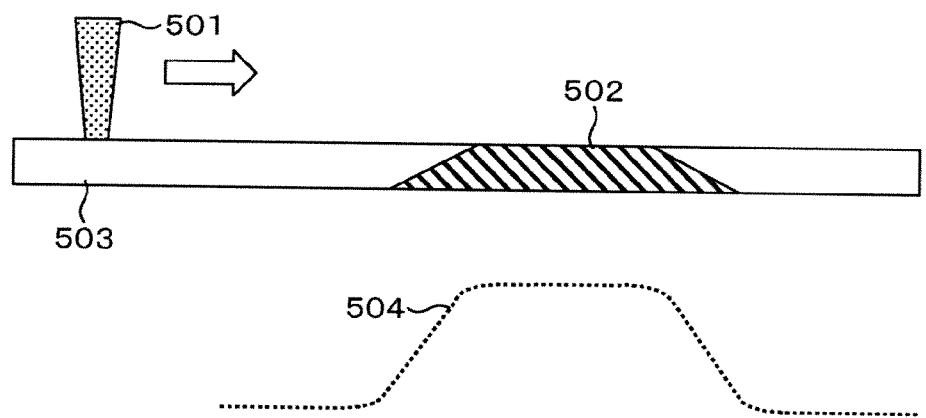
FIG. 5A shows a electron beam scanning, a signal waveform, and a line profile on a sample under optical conditions of detection of a reflected electron signal.
Figure 5B:
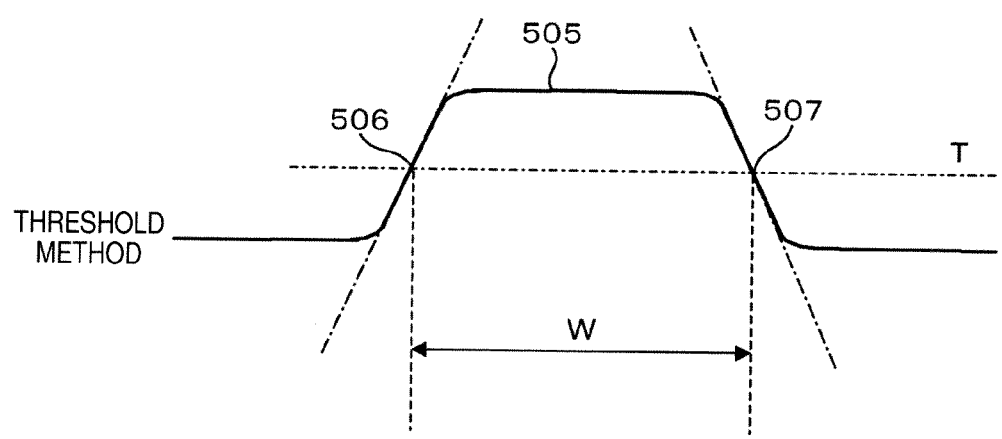
FIG. 5B shows a electron beam scanning, a signal waveform, and a line profile on a sample under optical conditions of detection of a reflected electron signal.

FIG. 5A shows electron beam scanning on the surface of a flat or low-step sample. When the surface of a sample 503 is scanned with an electron beam 501, a line profile 504 of a reflected electron signal indicative of electrons generated from a different circuit pattern 502, is obtained. With regard to the waveform 405 of a secondary electron signal on a rough-surfaced pattern, a sharp peak is obtained at a pattern edge part due to the edge effect. Meanwhile, with regard to a waveform 505 of a reflected electron signal, the waveform varies relatively moderately due to the material contrast of the sample. FIG. 5B is a diagram for explaining a threshold method. In this method, a part of the sample having a high contrast material is defined as a line, and a part of the sample having a low contrast material is defined as a space. As in FIG. 4B, a distance W between points 406 and 407 of intersections of both ends of the reflected electron signal waveform 505 and the threshold value T, is defined as a dimension of the circuit pattern 502.

A technique for finding dimensional values of a line and a space, when changeover between detection signals is made from the secondary electron signal to the reflected electron signal, will be explained below.

Figure 6A:
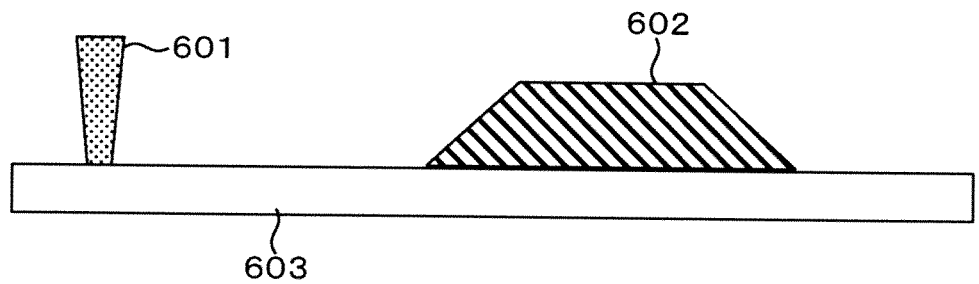
FIG. 6A schematically shows a cross sectional view of a sample made of various types of materials and having various surface configurations.
Figure 6B:
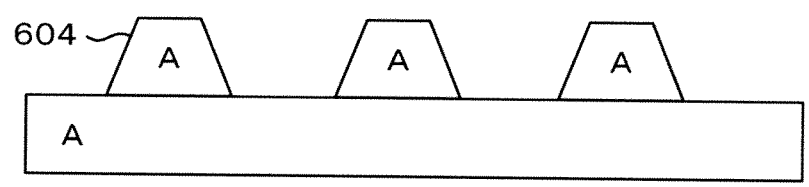
FIG. 6B schematically shows a cross sectional view of a sample made of various types of materials and having various surface configurations.
Figure 6C:
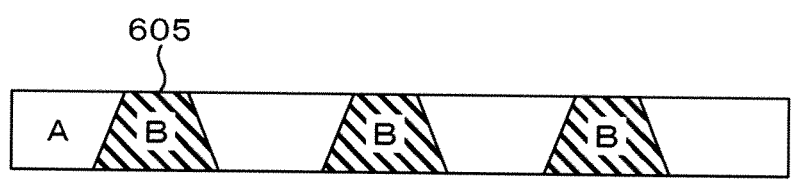
FIG. 6C schematically shows a cross sectional view of a sample made of various types of materials and having various surface configurations.
Figure 6D:
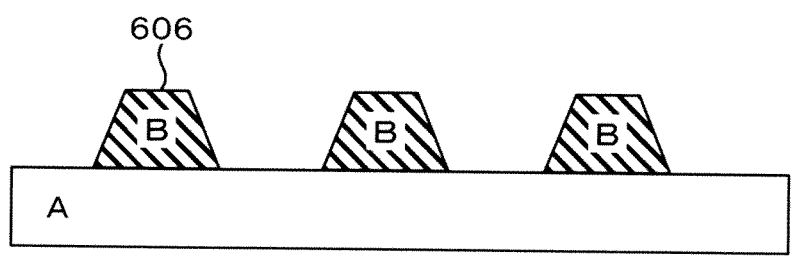
FIG. 6D schematically shows a cross sectional view of a sample made of various types of materials and having various surface configurations.

With respect to such a rough-surfaced sample 606 having patterns of the same size and of different sorts of materials as shown in FIG. 6D, both of a secondary electron image and a reflected electron image are acquired. Next, the both images are subjected to smoothing operation, a distance $W_{(SE)}$ between points 406 and 407 of intersections of slope parts of the secondary electron image waveform at both ends and a predetermined threshold value $T_{(SE)}$ is calculated as a dimensional value of the circuit pattern 402, and a dimensional value is similarly calculated from a distance $W_{(BSE)}$ between points 506 and 507 of intersections of a reflected electron image waveform and a constant threshold value $T_{(BSE)}$.

With use of patterns having different sizes, the values of the distances $W_{(SE)}$ and $W_{(BSE)}$ are similarly calculated, and a correlation curve of dimensional values of the secondary and reflected electron images is derived. The curve is approximated as a polynomial with use of a first-order line or a second-order curve and a coefficient is calculated therefrom. In the case of the first-order approximation, it is effective to divide an abscissa axis into several sections, find a collinear approximation equation in each section, and find an average of the obtained slopes. In the case of the second-order approximation, an average (division of an integrated value of values up to the saturation points by an integrated section) of values up to saturation points of the obtained approximation equations can be calculated.

An approximation curve can also be created with use of various sizes of patterns by adjusting the threshold value $T_{(BSE)}$ in such a manner that the dimensional values W of the aforementioned waveforms become the same.

Embodiment 3

Explanation will be made by using FIGS. 6A to 6D as to more suitable material design in order to find measured dimensional values at the time of detecting the reflected electron signal explained in Embodiment 2.

FIG. 6A schematically shows a cross sectional view of a sample for explaining electron beam scanning on the sample, and FIGS. 6B to 6D show cross sectional views of samples having different shapes and materials. As shown in FIG. 6A, when the surface of a sample 603 is scanned with an electron beam 601, a line profile (not shown) of a signal of the secondary electron generated from a circuit pattern 602 is obtained. As shown in FIG. 6B, with respect to an irregular sample 604 having the same material pattern as a current standard sample, when the sample 603 is scanned with the primary electron beam 601, use of the reflected electron image sensitive to the material contrast disables acquisition of an image quality equivalent to use of the secondary electron signal, and thus it becomes difficult to accurately measure dimensions. As shown in FIG. 6C, since a flat sample 605 having different sorts of material parts includes materials A and B, a high quality of reflected electron image can be obtained. Since the sample has no irregularities on its surface, however, it is impossible to perform dimensional measurement over the standard sample itself based on the aforementioned optical diffraction. When an irregular sample has patterns of different sorts of materials as shown in FIG. 6D, an irregular pattern having different sorts of materials A and B is formed. Thus, a high quality of reflected electron image can be obtained, and dimensional measurement of the sample itself can also be achieved. In the present embodiment, when changeover is made between signals from the secondary electron to the reflected electron with use of such a sample, an accurate correction coefficient can be derived not by simulation of the optical system but also by direct dimensional measurement on the sample. When a correction table is created and recorded by using correction coefficients found by actual measurement under the both optical conditions, it is possible to read out the associated data from the table and use it upon calibration of the optical system of the reflected electron detection. Further, when a standard sample is created using the above sample, the device can be adjusted for magnification and length measurement calibration even under the optical conditions of detection of the reflected electron signal.

In this way, when such samples as mentioned above are used, accurate calibration can be achieved by a similar technique even under the optical conditions of detection of the secondary electron or reflected electron separately solely or even under optical conditions of detection of a mixture of the secondary and reflected electrons mixed at a constant ratio. This is highly valid when a SEM device having a mechanism of detecting both signal electrons is adjusted.

The above explanation has been made in connection with the Embodiments. However, it will be clear from those skilled in the art that the present invention is not limited to the embodiments but may be modified and altered in various ways within spirit of the invention and the scope of attached claims.

REFERENCE SIGNS LIST

101: electron gun
102: primary electron beam
103: accelerating electrode
104: condenser lens
105, 306: deflectors
106, 307: objective lenses
107, 302, 403, 503, 603: samples
108: sample holder
109: sample stage
110: booster electrode
111: reflected electron
112: secondary electron
113: reflector
114, 902: detectors
115: signal processor
116: image display unit
117: conversion electrode
201, 205: substrates
202, 203, 206, 207, 402, 502, 602: circuit patterns
204: chromium (Cr) film
208: diamond-like carbon
301, 401, 501, 601: electron beams
303: formed image
304: objective aperture
305: condenser lens
404, 504: line profiles
405: secondary electron signal waveform after smoothed
406, 407: points of intersections between slope parts of a waveform at both ends and a threshold value T in a threshold method
408, 409: points between intersections of a waveform of tangent lines and a base line in a collinear approximation method
505: reflected electron signal waveform

506, 507: points of intersections between both ends of a waveform at both ends and a threshold value T in a threshold method
    604: irregular sample having patterns of the same material
    605: flat sample having different sorts of material parts
    606: irregular sample having patterns of different sorts of materials
    801a: shield mesh sheet
    801b: filter mesh sheet
    802: aperture
    803: power source
    804a: reflected electron detector
    804b: secondary electron detector
    901: SEM main unit
    903: A/D converter
    904: control unit
    905: operating unit
    906: memory
    907: input unit
    908: evaluation-conditions setter
    909: measurement-conditions setter
    910: image former
    911: data acquirer
    912: correction data calculator
    913: deflector controller

The invention claimed is:

1. A charged particle beam device comprising:
a charged particle source for emitting a charged particle beam;
an accelerating electrode for accelerating the charged particle beam;
a deflector for scanning and deflecting the charged particle beam;
an objective lens for converging the charged particle beam;
a sample stage for mounting a sample thereon;
a detector for detecting charged particles emitted from the sample;
an electrode located at a position closer to the sample than the detector for receiving a positive or a negative voltage; and
a control computer for supplying a signal to the deflector,
wherein the control computer controls the voltage applied to the electrode and supplies to signal to the deflector so as to correct a scanning deflection of the charged particle beam between a first detection condition of detection of a secondary charged particle and a second detection condition of detection of a reflected charged particle.

2. The charged particle beam device according to claim 1, wherein the control computer controls the voltage applied to the electrode so as to be changed over from the first detection condition of application of the positive voltage to the electrode to the second detection condition of application of the negative voltage to the electrode.

3. The charged particle beam device according to claim 1, wherein the control computer includes an operating unit for finding a correction coefficient to scan and deflect the charged particle beam and a recording unit for recording the correction coefficient found by the operating unit.

4. The charged particle beam device according to claim 3, wherein the correction coefficient is found on the basis of previously acquired reference data.

5. The charged particle beam device according to claim 3, wherein the correction coefficient indicates a relative relationship of values of previously acquired magnifications in the first and second detection conditions.

6. The charged particle beam device according to claim 5, wherein the values of the magnifications are found by optical simulation.

7. The charged particle beam device according to claim 3, wherein the correction coefficient indicates a relative relationship of values of previously acquired dimensions of the sample in the first and second detection conditions.

8. A charged particle beam device comprising an electron optical system,
the optical system including:
a charged particle source for emitting a charged particle beam, an accelerating electrode for accelerating the charged particle beam, a deflector for controlling a scanning deflection of the charged particle beam, and an objective lens for converging the charged particle beam;
an electron detection system for detecting a charged particle emitted from the sample; and
a control computer for supplying a signal to the deflector,
wherein the control computer controls the electron optical system to adjust a scanning deflection with use of a standard sample having known dimensions in a first optical condition of detection of a secondary charged particle emitted from the sample, to find a relative correction coefficient of values of previously acquired magnifications in both of a predetermined optical condition of detection of the secondary charged particle and a predetermined optical condition of detection of the reflected charged particle on the basis of the values of the magnifications in the predetermined optical conditions, and to derive a first signal applied to the deflector when the scanning deflection is adjusted with use of the standard sample and also to derive a second signal applied to the deflector when the optical condition is changed to the second optical condition of detection of a reflected electron emitted from the sample from the first optical condition on the basis of the correction coefficient.

9. The charged particle beam device according to claim 8, wherein the control computer includes an recording unit for recording the first signal, the magnification in the predetermined optical condition of detection of the secondary electron and the magnification in the predetermined optical condition of detection of the reflected electron, and also includes an operating unit for finding the correction coefficient, and the recording unit records the correction coefficient found by the operating unit.

10. The charged particle beam device according to claim 9, wherein the operating unit derives the second signal.

11. A method of irradiating a sample with a charged particle beam and scanning and deflecting the charged particle beam, the method including the steps of:
a first step of adjusting a scanning deflection with use of a standard sample having known dimensions in a first optical condition of detection of a secondary charged particle emitted from the sample;
a second step of finding a relative correction coefficient of values of previously acquired magnifications in both of a predetermined optical condition of detection of secondary charged particle and a predetermined optical condition of detection of a reflected electron on the basis of the values of the magnifications; and
a second step of deriving a first signal applied to the deflector when the scanning deflection is adjusted with use of the standard sample and deriving a second signal applied to the deflector in the second optical condition of detection of a reflected electron emitted from the sample on the basis of the correction coefficient.

12. A program includes:
a computer capable of receiving image data or design data from a scanning electron microscope or from a calculator via a network or an externally connected type of memory;
input means for inputting a parameter or the like for pattern matching and pattern measurement; and
display means for displaying the image data from the scanning electron microscope or a result of the pattern matching and pattern measurement,
wherein functions of the control computer set forth in claim 1 are executed by software.

* * * * *